(12) United States Patent
Nagayama

(10) Patent No.: US 7,334,907 B2
(45) Date of Patent: Feb. 26, 2008

(54) LIGHT-EMITTING DIODE

(75) Inventor: Makoto Nagayama, Fujikawaguchiko-machi (JP)

(73) Assignee: Citizen Electronics Co., Ltd., Yamanashi (JP)

( * ) Notice: Subject to any disclaimer, the term of this patent is extended or adjusted under 35 U.S.C. 154(b) by 153 days.

(21) Appl. No.: 11/089,020

(22) Filed: Mar. 25, 2005

(65) Prior Publication Data

US 2005/0219835 A1  Oct. 6, 2005

(30) Foreign Application Priority Data

Mar. 25, 2004  (JP)  ............... P2004-090690

(51) Int. Cl.
  *F21V 9/16*  (2006.01)
  *F21V 13/04*  (2006.01)
  *H01L 31/0232*  (2006.01)
(52) U.S. Cl. ................... 362/84; 257/98; 362/329; 362/800
(58) Field of Classification Search ............ 362/84, 362/327, 328, 329, 800; 257/98, 99, 100; 313/498–512
See application file for complete search history.

(56) References Cited

U.S. PATENT DOCUMENTS

| 6,576,931 | B2 * | 6/2003 | Furukawa et al. | 257/98 |
| 6,653,661 | B2 * | 11/2003 | Okazaki | 257/98 |
| 6,943,380 | B2 * | 9/2005 | Ota et al. | 257/100 |
| 2004/0164311 | A1 * | 8/2004 | Uemura | 257/99 |
| 2005/0045903 | A1 * | 3/2005 | Abe et al. | 257/100 |

FOREIGN PATENT DOCUMENTS

JP  2001-210872 A  8/2001

* cited by examiner

*Primary Examiner*—Alan Cariaso
(74) *Attorney, Agent, or Firm*—Browdy and Neimark, PLLC

(57) ABSTRACT

A light-emitting diode comprising a substrate having a surface on which connecting electrodes are formed and another surface on which terminal electrodes conducting with the connecting electrodes are provided, and an LED element mounted on the substrate, the LED element having an emission surface on one surface thereof, the emission surface being covered with a translucent resin containing fluorescent material, surfaces other than the emission surface being covered with a resin having a diffusion-reflection effect.

11 Claims, 12 Drawing Sheets

LIGHT-EMITTING DIODE

CROSS-REFERENCE TO THE RELATED APPLICATION

The application claims the priority benefit of Japanese Patent Application No. 2004-90690, filed on Mar. 25, 2004, the entire descriptions of which are incorporated herein by reference.

1. Field of the Invention

The present invention relates to a semiconductor apparatus, particularly, to a light-emitting diode (LED) having at least one LED element.

2. Description of Related Art

A light-emitting diode (LED) element, which is a kind of a semiconductor element, forms a junction on a wafer of a semiconductor compound such as InGaAlP or indium gallium aluminum phosphorus, GaN or gallium nitride, or the like, and configured to pass an electric current in a forward direction through the junction to acquire emission of visible light or near-infrared light. Here, the junction means a surface which generates light in an LED element when the current is applied to.

Recently, LEDs are widely used for instruments in fields of displays, communications, measurements, controls or the like. On the other hand, high performance, multi-functions, miniaturization, and weight saving are demanded for recent electronic instruments. In addition, an applicable scope of the LEDs is being expanded in fields particularly emphasizing heat release and reliability.

Therefore, LEDs used in the electronic instruments are often surface-mounted on a substrate provided with printed wirings, for example, as referred to as a surface-mounted device (SMD). Such electronic parts are mounted on wiring patterns provided on the substrate having a generally cuboidal shape as usual by a fixing means such as reflow soldering.

An LED for responding to the request has been developed, and one example thereof is disclosed in JP 2001-210872A (FIG. 1, paragraphs 0023 to 0027).

FIG. 21 illustrates a first conventional example of the SMD-type LED.

The LED 100 includes a substrate 101, which has a generally cuboidal shape and printed wirings provided on upper and lower surfaces thereof, and a blue light-emitting LED element 104 disposed on one of the upper and lower surfaces of the substrate 101. A pair of wiring patterns 102 and 103 are provided on the substrate 101, these wiring patterns 102 and 103 include connecting electrodes 102a and 103a disposed on the upper surface of the substrate, terminal electrodes 102b and 103b disposed on the lower surface of the substrate, and side electrodes connecting the connecting electrodes 102a, 103a and terminal electrodes 102b, 103b, respectively.

The LED element 104 is joined on the upper surface of the substrate 101, and wires 105 such as Au lines connect between electrodes on an upper surface of the LED element and the connecting electrodes 102a, 103a, respectively. In addition, a translucent resin 106 containing fluorescent material is applied to surfaces, for example, the upper surface and side surfaces of the LED element 104, further, from above, the LED element 104 and the wires 105 are protected with a sealing resin 107. The sealing resin 107 is made of translucent epoxy resin so as to emit light from the LED element 104 effectively. Reference number 108 denotes an adhesive as die bonding to join the LED element 104 on the substrate 101.

FIG. 22 illustrates a second conventional example of the SMD-type LED.

The LED 110 has a structure in which one of the connecting electrodes 103a provided on a substrate 111 extends to a central portion of the upper surface of the substrate 111. The LED element 104 is bonded on the extended portion of the connecting electrode 103a, that is different from the conventional example as shown in FIG. 21. Because the other structure of the LED 110 is similar to the LED 100 as shown in FIG. 21, a further description is omitted by attaching the same numbers to the similar parts. In addition, the LED 110 is more effective than the LED 100 in heat release.

FIG. 23 illustrates a third conventional example of the SMD-type LED.

The LED 120 has a structure in which the LED element 104 is sealed only by the fluorescent-material-containing resin 106, not using the sealing resin 107, that is different from the conventional example as shown in FIG. 22. Because the other structure of the LED 120 is the same as the LED 110 as shown in FIG. 22, a further description is omitted by attaching the same numbers to the similar parts.

FIG. 24 illustrates a first conventional example of the SMD-type LED.

The LED 130 has a structure in which a concave portion 131a is provided in a central portion of a substrate 131, the LED element 104 is disposed in the concave portion 131a, and the upper surface and the side surfaces of the LED element 104 are covered with the fluorescent-material-containing resin 106, that is different from the conventional example as shown in FIG. 21. Furthermore, a reflecting cup 109 is disposed on the substrate 131. The reflecting cup 109 is a frame-like resinous molding having an inclined inner wall surface. The reflecting cup 109 may be made of white color system resin, or glossy silver-plating or the like may be provided on the inner wall surface of the reflecting cup 109.

Because other structure of the LED 130 is the same as the LEDs as shown in the previous conventional examples, further descriptions are omitted by attaching the same numbers to the similar parts.

However, in the above-mentioned LEDs 100, and 110, it is difficult to apply the fluorescent-material-containing resin 106 to surfaces of the LED element 104 uniformly and thinly, because the resin flows downwardly at the side surfaces of the LED element) the density of the fluorescent material is different at upper and lower portions of the LED element. For this reason, variations of LED luminescence are caused.

Regarding the LED 120, there are variations of the fluorescent-material distribution and depositions of the fluorescent material in the translucent resin 106, and these cause variations of LED luminescent. In the LED 130, there are also depositions of the fluorescent material that causes variations of LED luminescence.

Furthermore, in each of the LEDs 100, 110, 120, and 130, a plurality of surfaces of the LED element 104 are covered with the fluorescent-material-containing translucent resin 106. Therefore, the light generated from the junction of the LED element 104 may hit the fluorescent material and be excited more than once. Excited light by the fluorescent material is hardly excited again, even if the excited light hits the fluorescent material more than once. Also, there is a problem that the excess fluorescent material may shield the excited light, and as a result, conversion efficiency of light is lowered.

SUMMARY OF THE INVENTION

An object of the present invention is to provide a light-emitting diode (LED) having a uniformity of light and a higher luminescence.

To achieve the above object, according to one embodiment of the present invention, the LED includes a substrate having a surface on which connecting electrodes are formed and connected to the terminal electrodes on another surface of the substrate, and an LED element mounted on the substrate. The LED element has an emission surface that is one surface thereof. The emission surface is covered with a translucent resin containing fluorescent material. Surfaces other than the emission surface are covered with a resin having a diffusion reflection effect.

According to another embodiment of the present invention, all surfaces of the LED element other than the emission surface is covered with the resin having the diffusion-reflection effect, and light emitted from the LED element emits from only the emission surface.

DETAILED DESCRIPTION OF THE PREFERRED EMBODIMENTS

Several preferred embodiments according to the present invention will be explained with reference to the accompanying drawings hereinafter.

Figure 1:
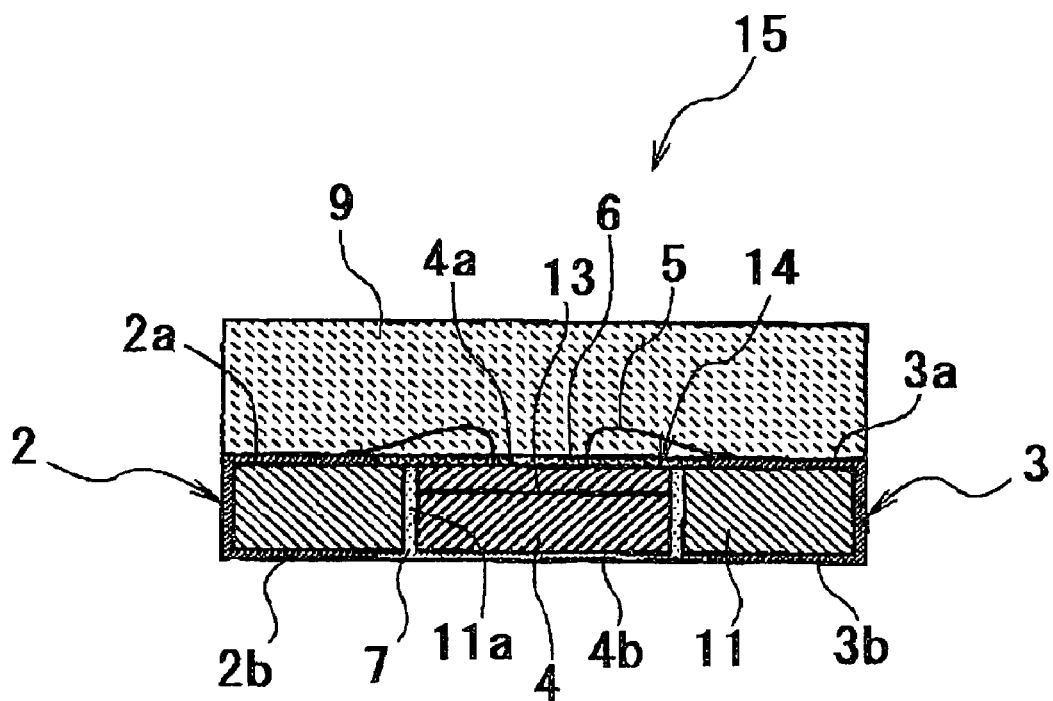
FIG. 1 is a longitudinal sectional view showing a first embodiment of an LED according to the present invention.
Figure 2:
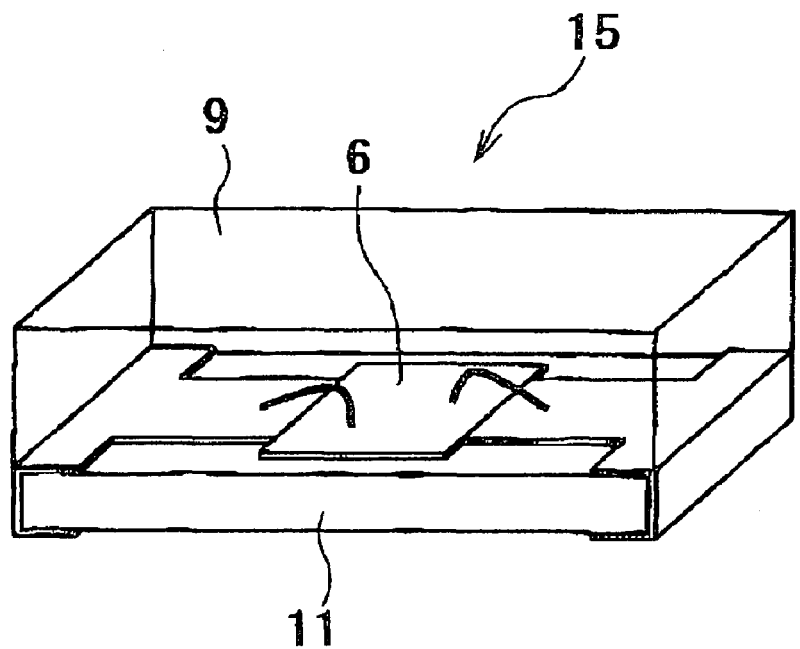
FIG. 2 is a perspective view showing the first embodiment of the LED according to the present invention.

FIGS. 1 and 2 illustrate a first embodiment of an LED according to the present invention. The LED here uses a surface-mounted-device (SMD)-type LED element in an example. The LED 15 in the embodiment has an outer shape like a cuboid and includes a flat plate-like substrate 11 having printed wirings provided on both surfaces thereof, for example, upper and lower surfaces. A hole 11a penetrating through the substrate 11 and having a quadrangular shape in section is provided in a central portion of the substrate 11.

A pair of wiring patterns 2 and 3 are provided at opposite side surfaces on the substrate 11 across the hole 11a, their wiring patterns 2 and 3 are formed in such a manner that connecting electrodes 2a and 3a are disposed on the upper surface of the substrate 11, terminal electrodes 2b and 3b are disposed on the lower surface of the substrate 11, and the connecting and terminal electrodes are connected by, for example, through-holes (not shown), when manufacturing a plurality of LEDs as an aggregation.

As an LED element, for example, a blue light-emitting diode element 4 is inserted in the hole 11a of the substrate 11 and fixed therein through a white color system resin 7, which will be described hereinafter. The LED element 4 has an emission surface 14 parallel with a junction 13 in the LED element 4. The emission surface 14 shares the same surface as an electrode surface 4a of the LED element 4 in this embodiment, and the emission surface 14 is disposed to direct upward, namely, to face up.

The electrode surface 4a of the LED element 4, and the connecting electrodes 2a and 3a are connected electrically by bonding wires 5 made of gold wires or the like, respectively. The emission surface 14 of the LED element 4 is covered with a translucent resin 6 containing fluorescent material, having a predetermined thickness. The fluorescent material is, for example, a YAG (yttrium aluminum garnet) system or the like, and dispersed in the resin. If the fluorescent-material-containing resin 6 has a thickness, the fluorescent material may be deposited to close to the emission surface 14 of the LED element 4. On the other hand, when the fluorescent-material-containing resin 6 is thinner such as a film, the fluorescent material may be dispersed in the resin uniformly. If only conversion efficiency of light by the fluorescent material is considered, it is preferable that a layer of the fluorescent-material-containing resin is thinned.

In addition, all side surfaces of the LED element 4 except the emission surface 14 are covered with the white color system resin 7.

The resin 7 comprises a white color system resin having a diffusion-reflection effect, or resin containing white color filler having a high diffusion-reflection effect, such as titanium oxide or the like. Here, the diffusion-reflection effect means that light emitted from a light source is uniformly diffused in all directions when it is reflected on a textured surface which is lusterless. In the embodiment, the provided fluorescent-material-containing resin which covers the emission surface 14 of the LED element 4 is thin like a film and the bonding wires 5 are covered with a translucent sealing member 9 having a cuboid-like shape, provided on the substrate 11. If the provided fluorescent-material-containing resin G has a thickness, the fluorescent material deposits close to the emission surface 14 of the LED element 4. Moreover, if the fluorescent-material-containing resin 6 has enough thickness to cover the bonding wires 5, the fluorescent-material-containing resin 6 can also work as a protecting member of the bonding wires 5. In this case, the sealing resin 9 is not needed to provide separately.

Figure 3:
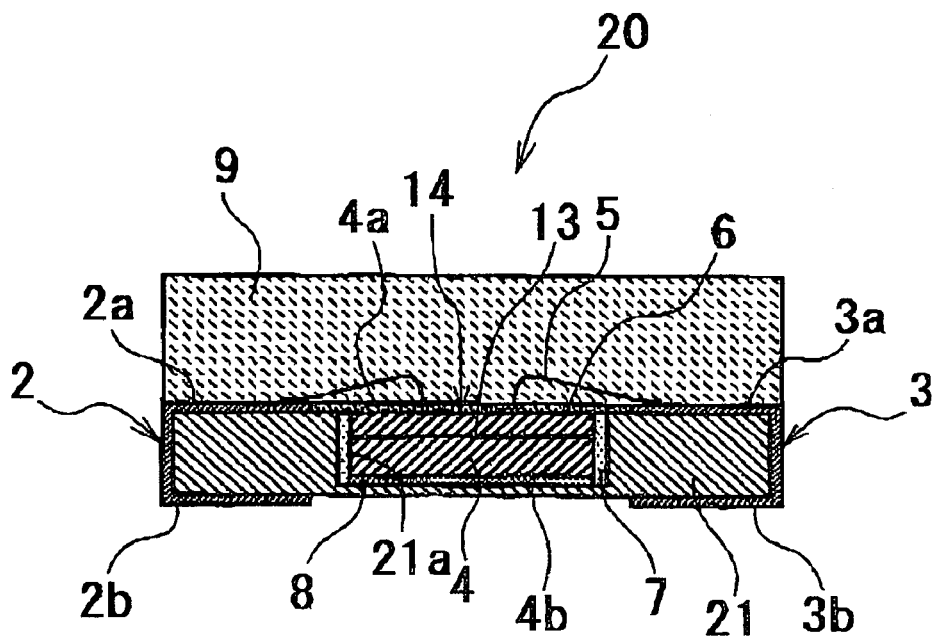
FIG. 3 is a longitudinal sectional view showing a second embodiment of the LED according to the present invention
Figure 4:
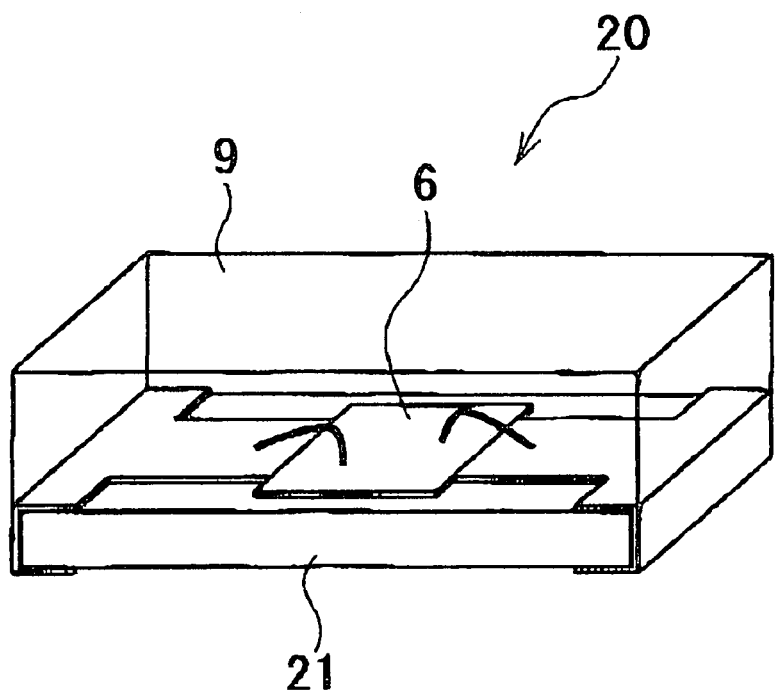
FIG. 4 is a perspective view showing the second embodiment of the LED according to the present invention.

FIGS. 3 and 4 illustrate a second embodiment of the SMD-type LED according to the present invention.

The LED 20 in the embodiment has a substrate 21 made of a material having a diffusion-reflection effect. For example, the substrate comprises a substrate made of a white color system resin, a substrate made of white color system ceramic, a metallic substrate made of aluminum, silver or the like and having a rough surface, or a substrate having a roughly plated surface.

A quadrangular concave portion 21a is provided in a central portion of the substrate 21. The LED element 4 has an opposite surface 4b to the electrode surface 4a, which is on the same surface as the emission surface 14. The LED element 4 is disposed in the concave portion 21a, and the opposite surface 4b is adhered to a bottom surface of the concave surface 21a by an adhesive 8. All the side surfaces of the LED element 4, except the emission surface 14 and the opposite surface 4b of the emission surface 14 are covered with the white color system resin 7. The adhesive 8 is preferably a white color system having a diffusion-reflection effect.

The substrate 21 may be made of a metallic substrate structured to have a mirror-reflection effect by processing the bottom surface of the concave portion 21a, which is an adhered surface of the LED element 4 into a mirror surface or providing a mirror surfaced plating thereon. In this case, a translucent adhesive is preferably used. Here, the mirror-reflection effect means that the light emitted from the light source enters a glossy surface and is reflected strongly in a reflecting direction opposite to the incident. A metallic member made of glossy aluminum or silver member having glossy silver plating or the like, for example, may be used instead of the member having the mirror-reflection effect as described above. Because other structure of the LED 20 in this embodiment is similar to the LED 15 in the first embodiment, a detailed description thereof is omitted by attaching the same numbers to the similar parts.

Figure 5:
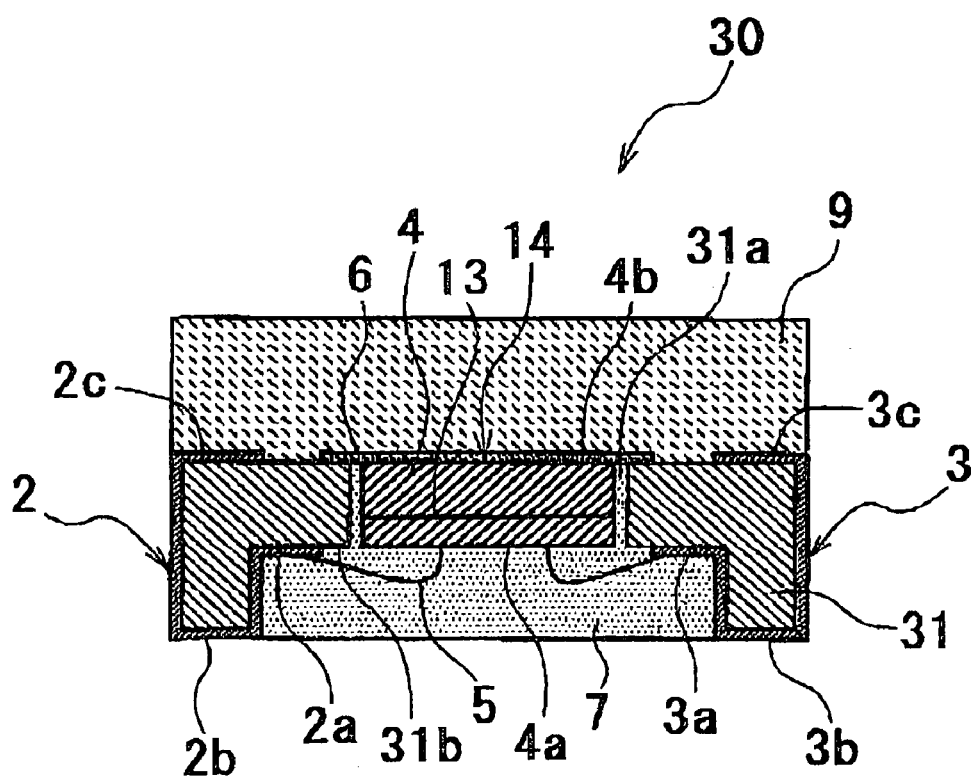
FIG. 5 is a longitudinal sectional view showing a third embodiment of the LED according to the present invention.
Figure 6:
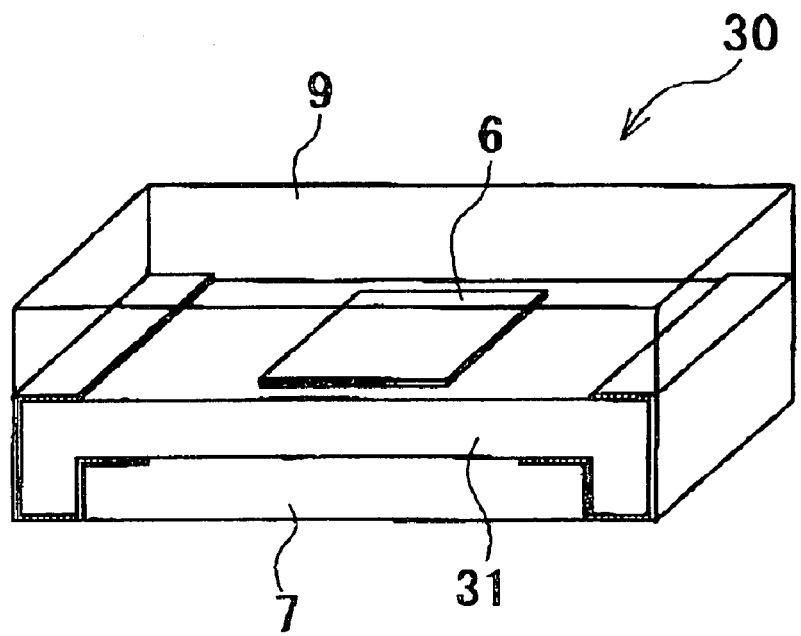
FIG. 6 is a perspective view showing the third embodiment of the LED according to the present invention.

FIGS. 5 and 6 illustrate a third embodiment of the SMD-type LED according to the present invention.

The LED 30 in this embodiment includes a substrate 31 having a hole 31a formed on a central portion thereof and a step 31b formed on a bottom surface thereof. The wiring patterns 2 and 3 are adapted to form patterns by connecting electrodes 2a and 3a provided on a ceiling surface of the step 31b, terminal electrodes 2b and 3b provided on a lower surface of the step, upper electrodes 2c and 3c extending from opposite side surfaces of the substrate 31 to an upper surface thereof. The LED element 4 is disposed in the hole 31a, and the electrode surface 4a of the LED element 4, disposed to direct downward and the electrode surface 4a is connected to the connecting electrodes 2a and 3a through the bonding wires 5, respectively. An interspace between each side surface of the LED element 4 and each wall of the substrate 31 forming the hole 31a, and a concave-space defined by the step 31b are filled with the white color system resin 7.

In this embodiment, the opposite surface 4b to the electrode surface 4a is parallel with the junction 13 of the LED element 4, and forms the emission surface 14. The emission surface 14, and the top surfaces of the interspace which is filled with the white color system resin 7 are covered with the translucent resin 6 containing the fluorescent material by a predetermined thickness. Because other structure of the LED 30 is similar to the structure of the LED 15 in the first embodiment, a detailed description thereof is omitted by attaching the same numbers to the similar parts.

Figure 7:
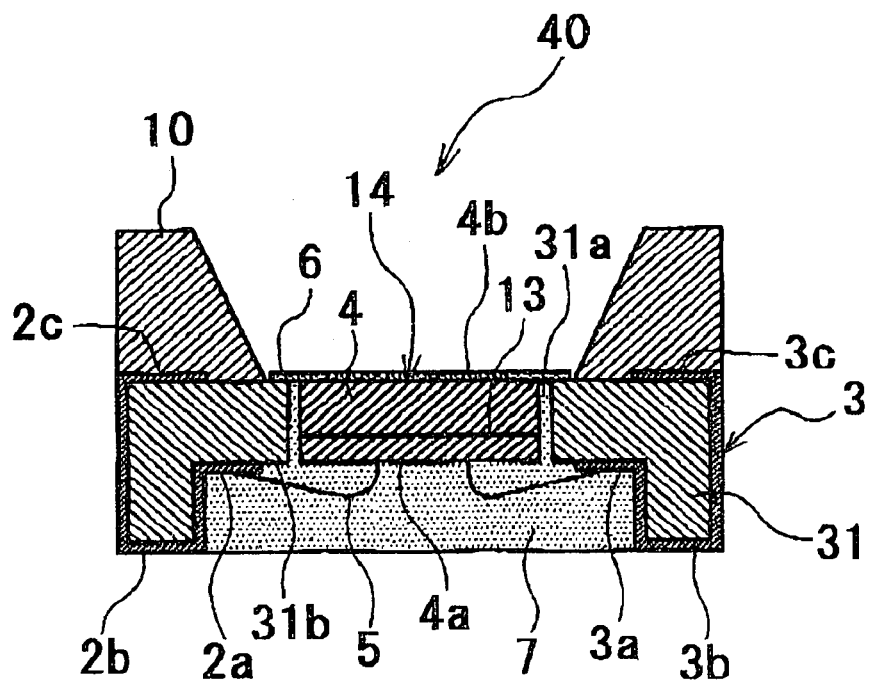
FIG. 7 is a longitudinal sectional view showing a fourth embodiment of the LED according to the present invention.
Figure 8:
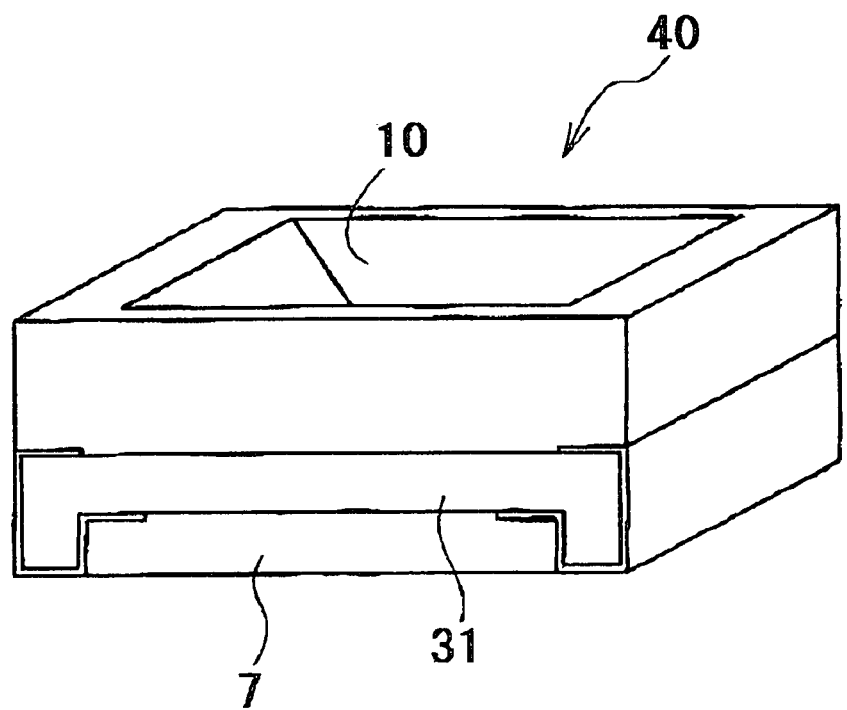
FIG. 8 is a perspective view showing the fourth embodiment of the LED according to the present invention.

FIGS. 7 and 8 illustrate a fourth embodiment of the SMD-type LED according to the present invention.

The LED 40 in this embodiment includes a reflecting cup 10 disposed on the substrate 31. The reflecting cup 10 has a frame-shaped member whose inner wall surfaces have inclined reflecting surfaces 10a disposed to surround the LED element 4. The reflecting cup 10 comprises a molded article made of, for example, a white color system resin or ceramic, or a metallic frame whose inner surfaces are processed into mirror surfaces.

In this way, the LED 40 in this embodiment is different from the LED 30 in the third embodiment only in that the reflecting cup 10 is attached on the substrate 31 in place of the sealing resin 9. Other structure of the LED 40 is similar to the structure of the LED 30. Therefore, a detailed description thereof is omitted by attaching the same numbers to the similar parts.

Figure 9:
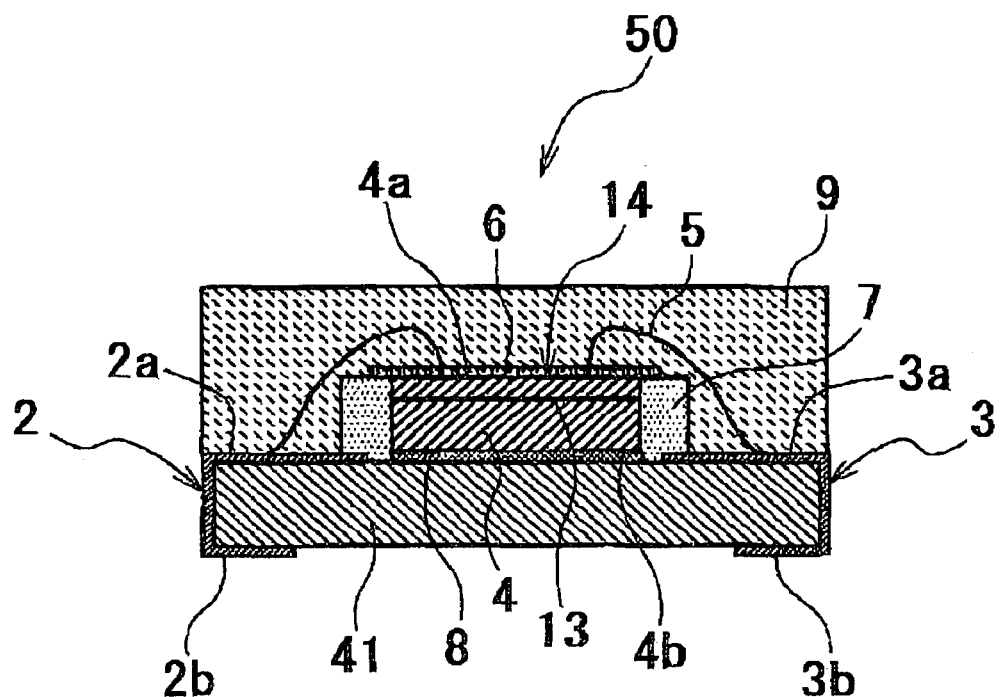
FIG. 9 is a longitudinal sectional view showing a fifth embodiment of the LED according to the present invention.
Figure 10:
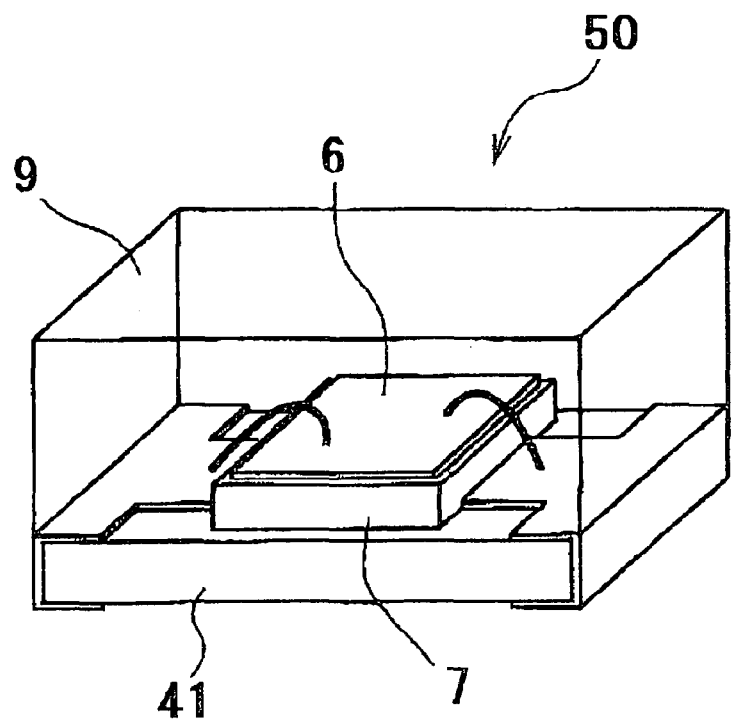
FIG. 10 is a perspective view showing the fifth embodiment of the LED according to the present invention.

FIGS. 9 and 10 illustrate a fifth embodiment of the SMD-type LED according to the present invention.

The LED 50 in this embodiment includes a substrate 41 having printed wirings provided on both surfaces thereof. The LED element 4 is adhered on an upper surface of the substrate 41 by adhesive 8. A translucent adhesive for die bonding is used for the adhesive 8, if the substrate 41 is formed to have a diffusion-reflection effect. All the side surfaces of the LED element 4, except the electrode surface 4a which is the emission surface 14 and the opposite surface 4b of the LED element 4, are covered with the white color system resin 7. Upper surfaces of the emission surface 14, and the white color system resin 7 are covered with the fluorescent-material-containing resin 6 and has a predetermined thickness. Because other structure of the LED is similar to the structure of the LED 20 in the second embodiment, a detailed description thereof is omitted by attaching the same numbers to the similar parts.

Figure 11:
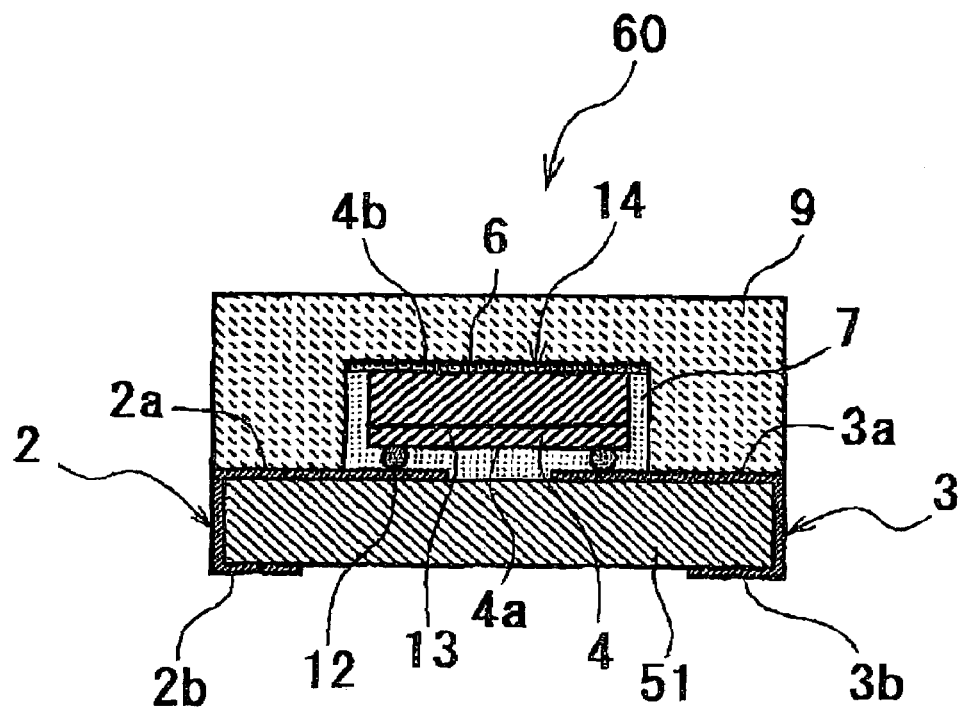
FIG. 11 is a longitudinal sectional view showing a sixth embodiment of the LED according to the present invention.
Figure 12:
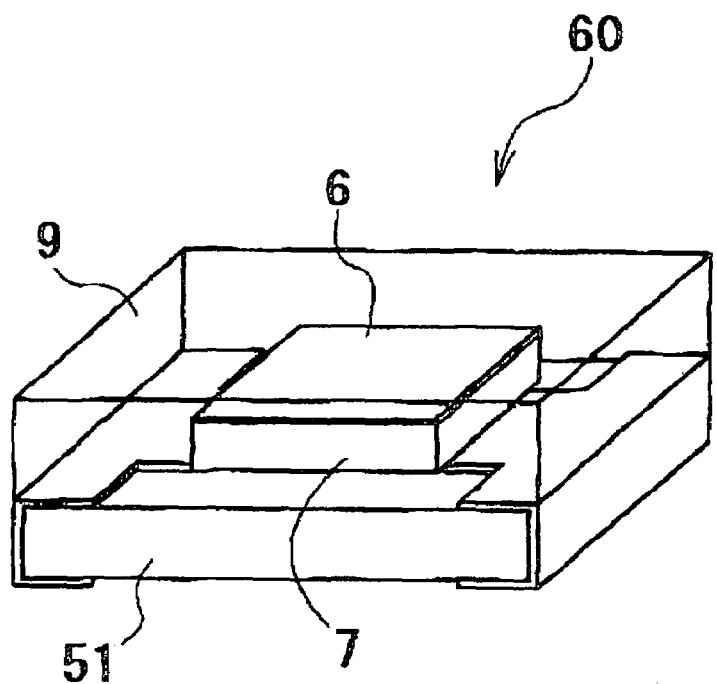
FIG. 12 is a perspective view showing the sixth embodiment of the LED according to the present invention.

FIGS. 11 and 12 illustrate a sixth embodiment of the SMD-type LED according to the present invention.

The LED 60 in this embodiment uses a substrate 51 having printed wirings provided on upper and lower surfaces, similarly to the fifth embodiment, while the LED element 4 is bonded on the connecting electrodes 2a and 3a through bumps 12. In this embodiment, the opposite surface 4b to the electrode surface 4a is the emission surface 14 of the LED element 4. An interspace between the electrode surface of the LED element 4 and the substrate 51 and the side surfaces of the LED element 4 except the emission surface 14 are filled with the white color system resin 7.

Upper surfaces of the emission surface 14 and the white color system resin 7 are at the same level and are covered with the translucent resin 6 containing the fluorescent material. Because other structure of the LED is similar to the structure of the LED 50 in the fifth embodiment, a detailed description thereof is omitted by attaching the same numbers to the similar parts.

Figure 13:
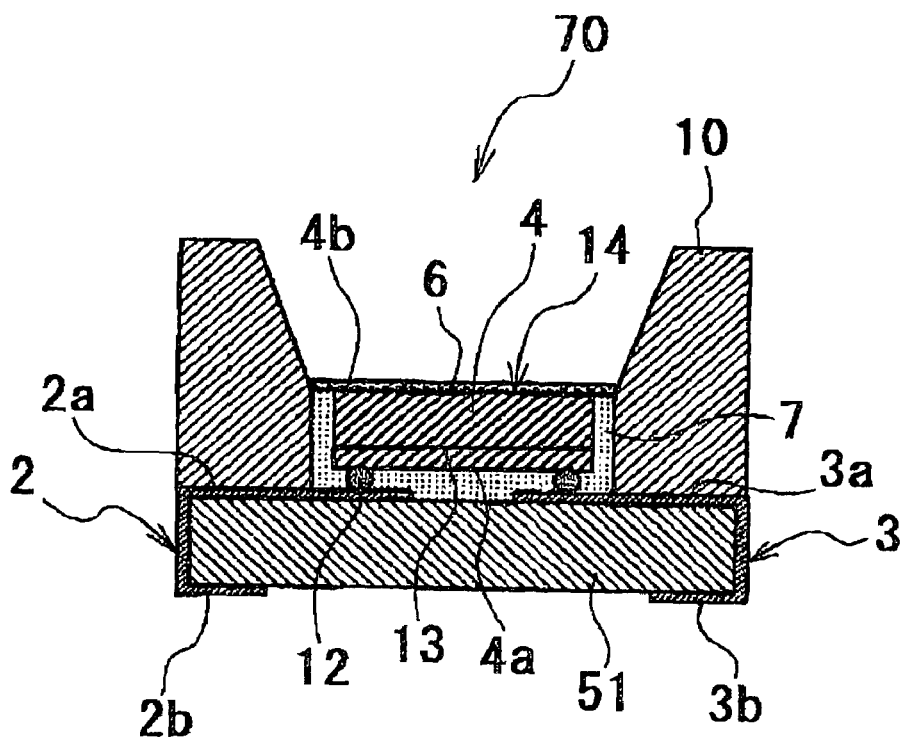
FIG. 13 is a longitudinal sectional view showing a seventh embodiment of the LED according to the present invention.
Figure 14:
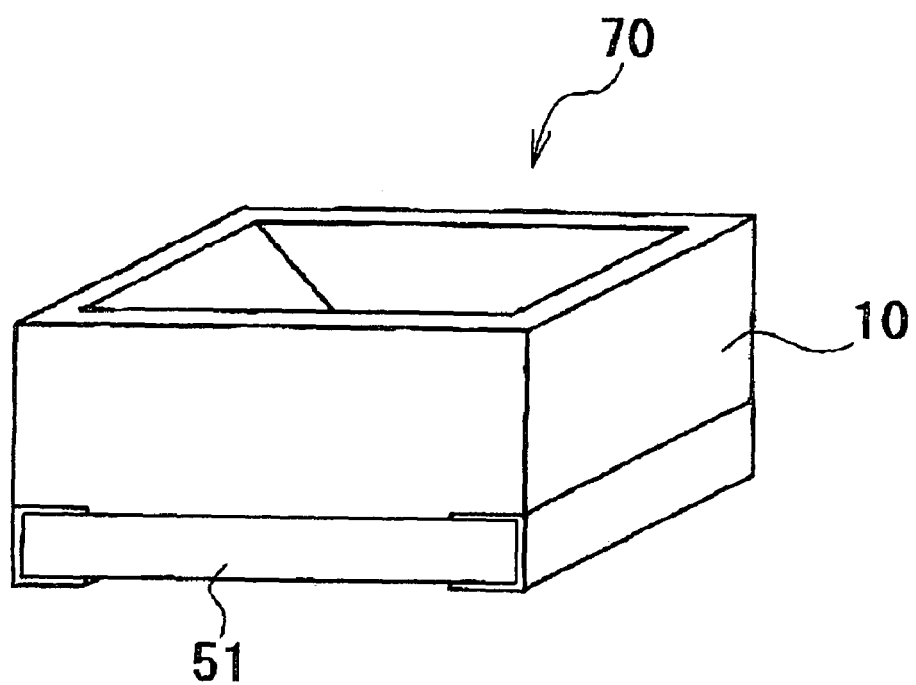
FIG. 14 is a perspective view showing the seventh embodiment of the LED according to the present invention.

FIGS. 13 and 14 illustrate a seventh embodiment of the SMD-type LED according to the present invention.

The LED 70 in this embodiment is structured to be surrounded by a reflecting cup 10 having an inclined reflecting surface provided on an inner wall surface thereof. The LED is different from the LED 60 in the sixth embodiment in using the reflecting cup instead of the sealing resin 9. Other structure thereof is similar, and a detailed description thereof is omitted by attaching the same numbers to the similar parts.

Figure 15:
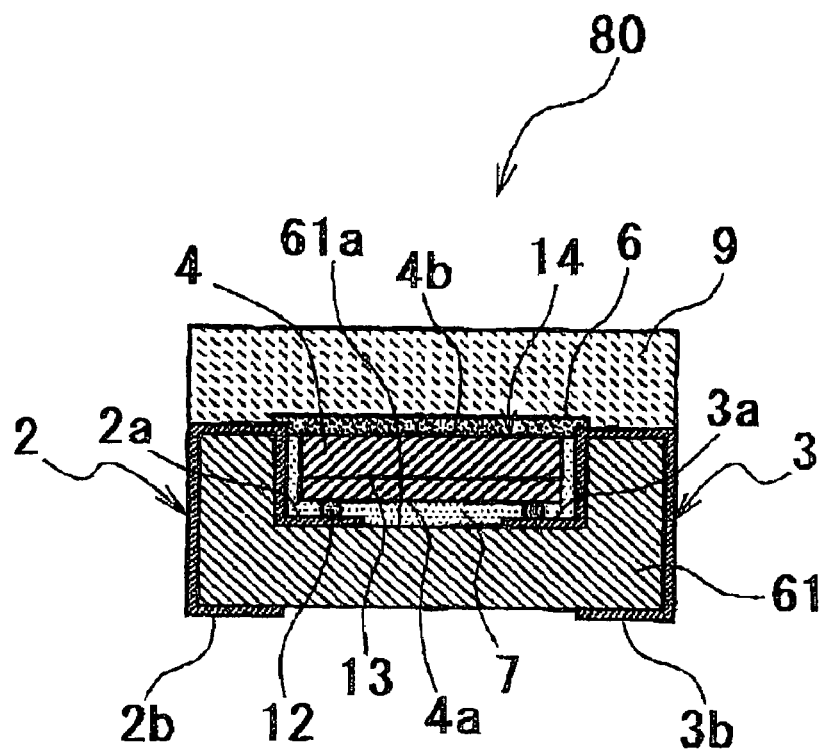
FIG. 15 is a longitudinal sectional view showing an eighth embodiment of the LED according to the present invention.
Figure 16:
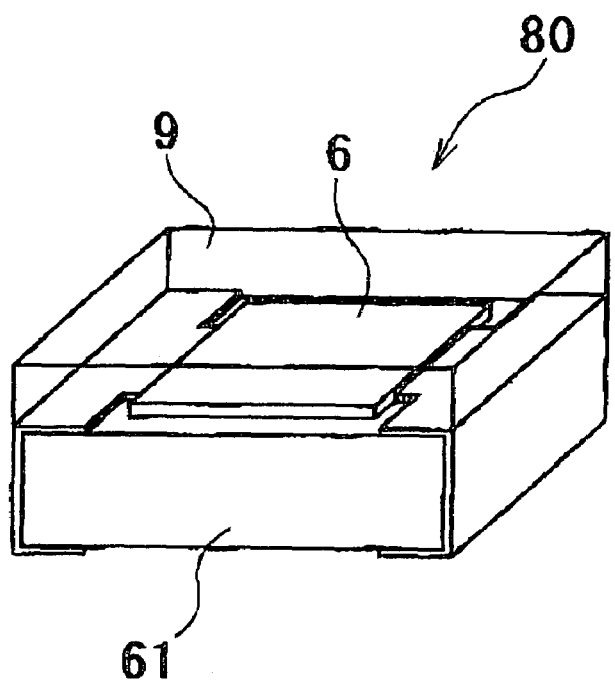
FIG. 16 is a perspective view showing the eighth embodiment of the LED according to the present invention.

FIGS. 15 and 16 illustrate an eighth embodiment of the SMD-type LED according to the present invention.

The LED 80 in this embodiment includes a substrate 61 which has printed wirings on both surfaces thereof, and a concave portion 61a is formed in a central portion of the substrate. The wiring patterns 2 and 3 are structured by a pair of connecting electrodes 2a and 3a provided on a bottom surface of the concave portion 61a, and terminal electrodes 2b and 3b provided on a lower surface of the substrate 61 which extend around sides of the substrate from the connecting electrodes 2a and 3a respectively.

The LED element 4 is bonded with the connecting electrodes 2a and 3a in the concave portion 61a through bumps 12. An interspace between the LED element 4 and the concave portion 61a and side surfaces of the LED element 4 except the emission surface are filled with the white color system resin 7. Because other structure of the LED 80 is similar to the structure of the LED 60 in the fifth embodiment, a detailed description thereof is omitted by attaching the same numbers to the similar parts.

Figure 17:
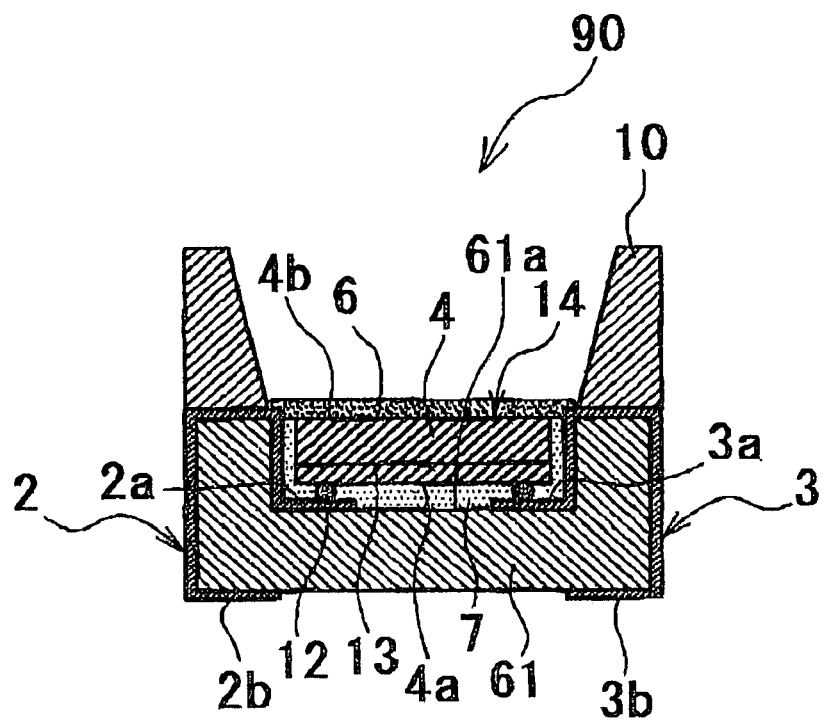
FIG. 17 is a longitudinal sectional view showing a ninth embodiment of the LED according to the present invention.
Figure 18:
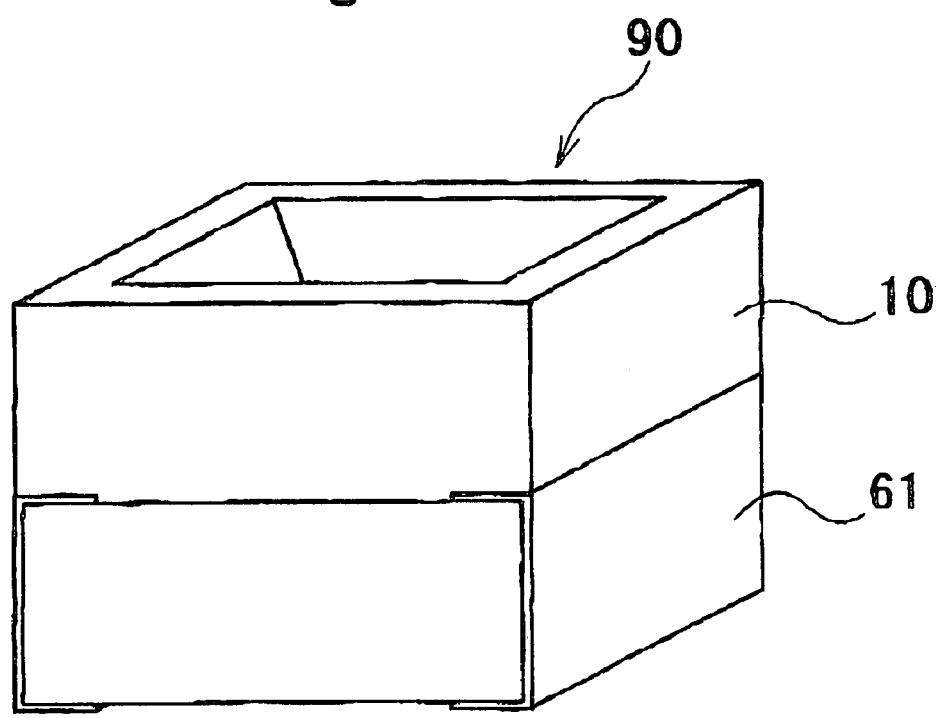
FIG. 18 is a perspective view showing the ninth embodiment of the LED according to the present invention.

FIGS. 17 and 18 illustrate a ninth embodiment of the SMD-type LED according to the present invention.

The LED 90 in this embodiment is structured to be surrounded by a reflecting cup 10 having an inclined reflecting surface provided on an inner wall surface thereof. The LED 90 is different from the LED 80 in the eighth embodiment only in use of the reflecting cup instead of the sealing resin 9. Other structure is similar to the structure of the LED 80. Therefore a detailed description thereof is omitted by attaching the same numbers to the similar parts.

Next, operations and effects in the embodiments described above are mentioned.

Of light generated from the junction 13 in the LED element 4, the light reaching directly to the emission surface 14 covered with the translucent resin 6 containing the fluorescent material is excited at the time. Because the light which directs to the lower surface or side surfaces of the LED and hits the portions having no fluorescent material is reflected on the resin having a diffusion-reflection effect and covering the lower surface or side surfaces of the LED element 4, and the reflected light is excited when returned to the emission surface 14 and being hit by the fluorescent material, it is converted into white color light efficiently only at the emission surface.

Moreover, because the resin 6 containing the fluorescent material is thin like a film and applied only to one surface, namely, the emission surface 14 of the LED element 4, even if the fluorescent-material-containing resin having a higher viscosity or density is used, the resin can be applied to the emission surface in a form of film. Therefore, the evenness of diffusion, or deposition of the fluorescent material and so on can be controlled.

Accordingly, the uniformity of light and luminance emitted from the LED can be controlled. Furthermore, since the emission surface is flat, luminance of the LED element in the front direction can be increased greatly, if the reflecting cup 10 is provided, as in the LEDs 40, 70 and 90.

Figure 19:
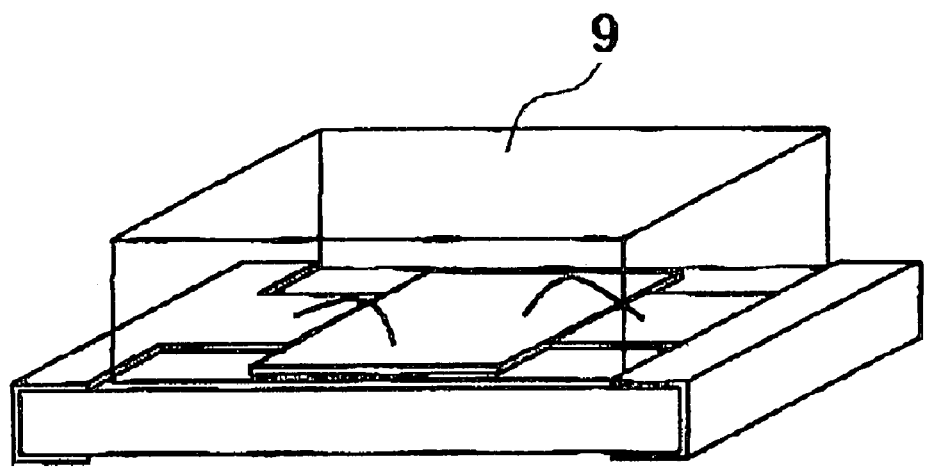
FIG. 19 is a perspective view showing another embodiment of the LED according to the present invention.
Figure 20:
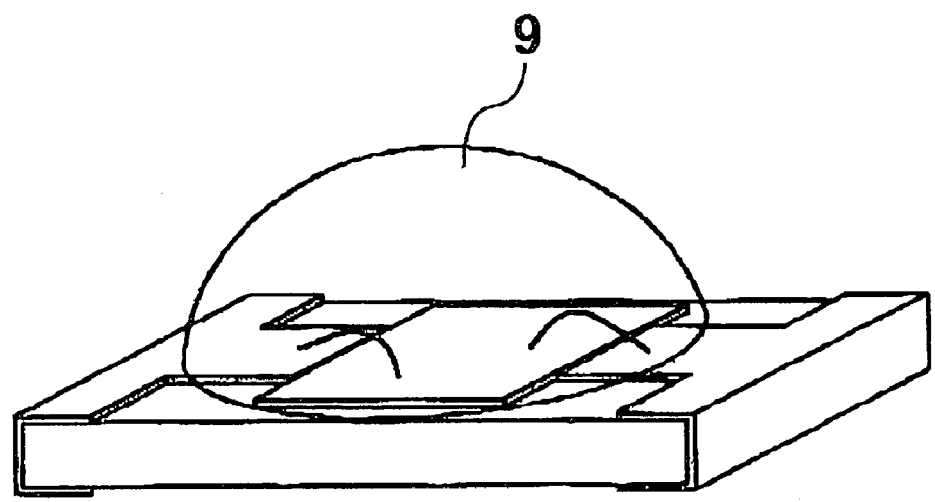
FIG. 20 is a perspective view showing still another embodiment of the LED according to the present invention.
Figure 21:
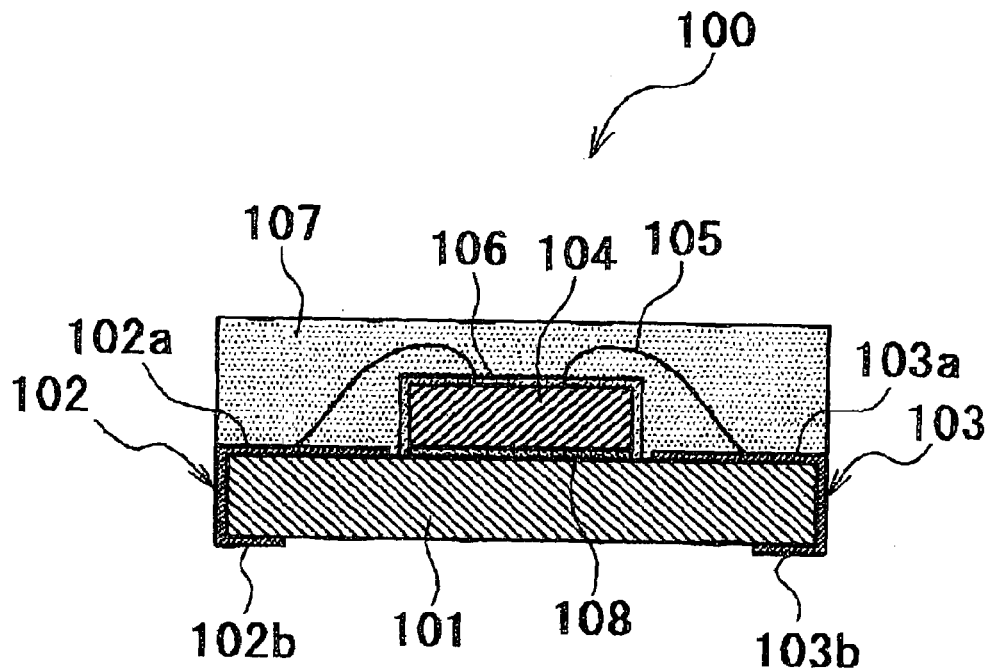
FIG. 21 is a longitudinal sectional view showing an LED in a first conventional example.
Figure 22:
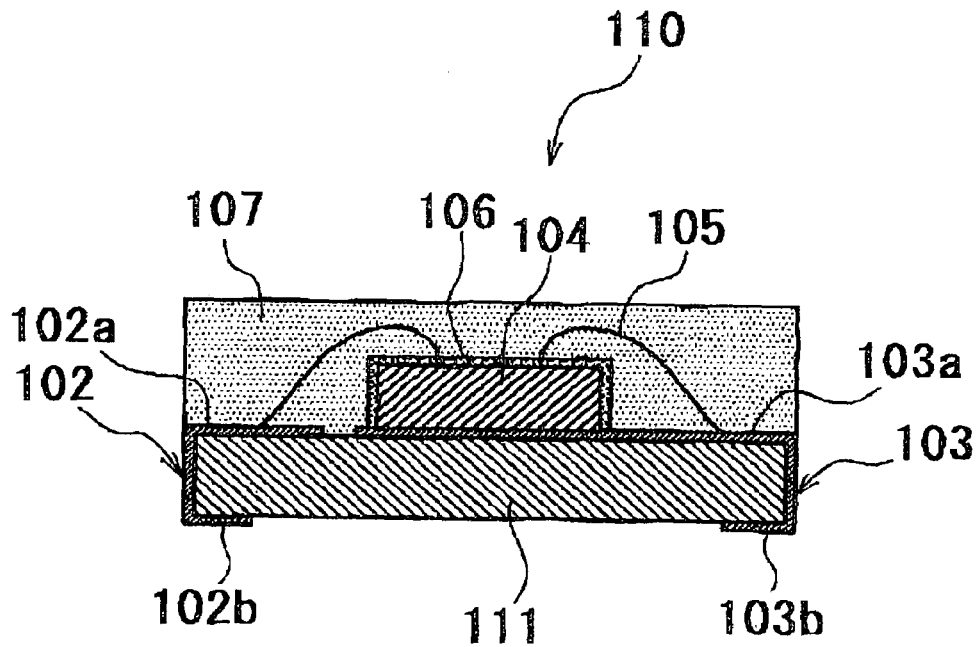
FIG. 22 is a longitudinal sectional view showing an LED in a second conventional example.
Figure 23:
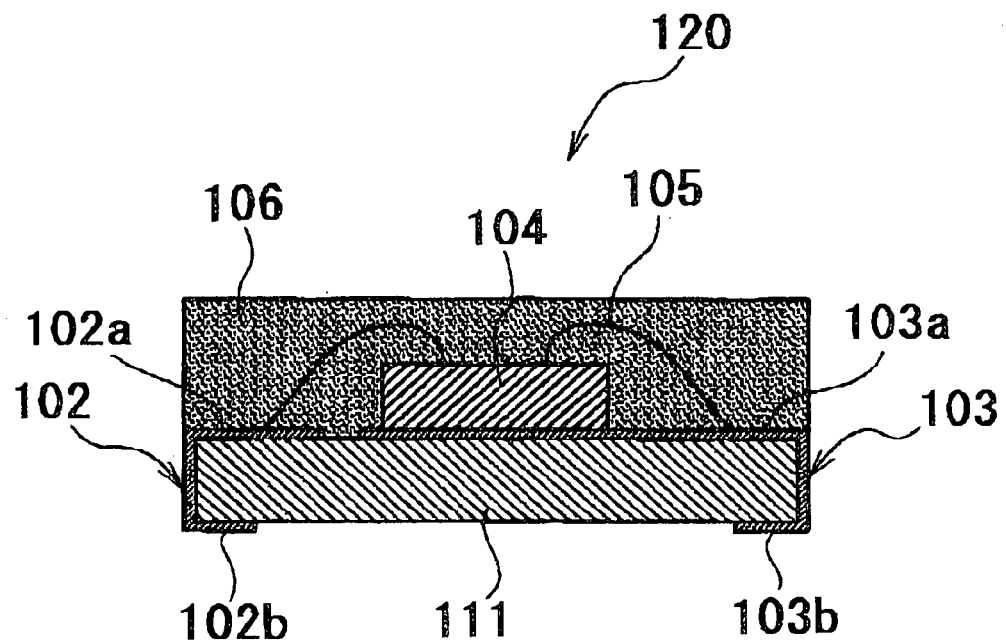
FIG. 23 is a longitudinal sectional view showing an LED in a third conventional example.
Figure 24:
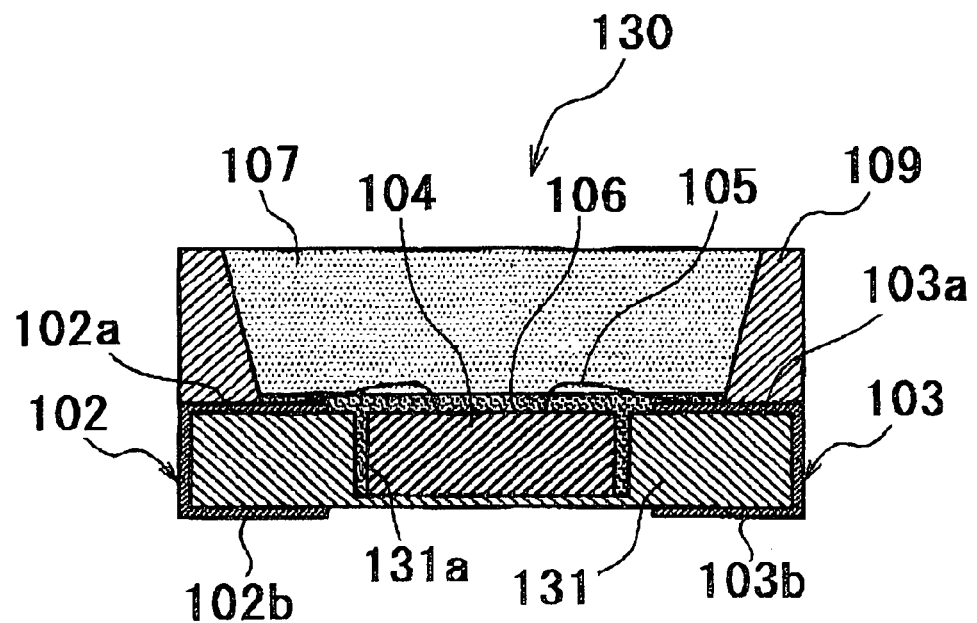
FIG. 24 is a longitudinal sectional view showing an LED in a fourth conventional example.

The present invention is not limited to the above-mentioned embodiments. For example, an outer shape of the translucent sealing resin 9 for protecting the LED element 4 can be formed into a shape as shown in FIGS. 19 and 20. In other words, in case of the LEDs 15, 20, 30 60 and 80, the shape of the sealing resin 9 may be formed into a cuboidal shape lesser than the outer shape of the substrate, into a dome shape as shown in FIG. 20. Moreover, the sealing resin 9 or the reflecting cup 10 is not needed to be disposed on the substrate, and the LED which has no sealing resin or reflecting cup may be formed as a complete product.

Moreover, an outer shape of the reflecting cup 10 in each of the LEDs 40, 70, and 90 may be smaller than that of the substrate. In addition, an inner wall surface of the reflecting cup 10 may be formed into a generally polygonal pyramid shape, a generally conical shape, a generally spherical shape, a generally paraboloidal shape or the like. By adopting these shapes, the increment of luminescence emitted from LED in the front direction is achieved and the directivity can be adjusted.

The light-emitting diode according to the present invention is used widely in various displays or instruments in fields of communication, metering, or control.

What is claimed is:

1. A light-emitting diode, comprising:
   a substrate; and
   a light-emitting element mounted on the substrate, and electrically connected to the substrate,
   wherein the light-emitting element has an emission surface provided on an upper surface thereof, and side surfaces and a lower surface covered with a resin having a diffusion-reflection effect,
   wherein the emission surface of the light-emitting element and an upper surface of the resin which covers the side surface are covered with a thin layer of a fluorescent material-contained resin.

2. The light-emitting diode according to claim 1,
   wherein the resin having the diffusion-reflection effect comprises any one of a white-colored resin or a resin mixed with a titanium oxide filler.

3. The light-emitting diode according to claim 1,
   wherein the emission surface of the light-emitting element is surrounded by a frame-like member having a reflecting surface.

4. The light-emitting diode according to claim 1,
   wherein an upper surface of the thin layer of the fluorescent material-contained resin is covered with a sealing resin.

5. The light-emitting diode according to claim 1,
   wherein the emission surface is parallel to a junction in the light emitting element.

6. The light-emitting diode according to claim 1,
   wherein the thin layer of the fluorescent material-contained resin comprises a film.

7. A light-emitting diode, comprising:
   a substrate including a through-hole; and
   a light-emitting element disposed in the through-hole of the substrate and electrically connected to the substrate,
   wherein the light-emitting element has an emission surface provided on an upper surface thereof, and side surfaces and a lower surface of the light-emitting element covered with a resin having a diffusion-reflection effect,
   wherein the emission surface of the light-emitting element and an upper surface of the resin which covers the side surfaces are covered with a thin layer of a fluorescent material-contained resin.

8. The light-emitting diode according to claim 7, wherein the thin layer of the fluorescent material-contained resin comprises a film.

9. A light-emitting diode, comprising:

a substrate including a concave portion; and a light-emitting element disposed in the concave portion of the substrate and electrically connected to the substrate, wherein the light-emitting element has an emission surface provided on an upper surface thereof and side surfaces and a lower surface of the light-emitting element covered with a resin having a diffusion-reflection effect, wherein the emission surface of the light-emitting element and an upper surface of the resin which covers the side surface are covered with a thin layer of a fluorescent material-contained resin.

10. The light-emitting diode according to claim 9, wherein the thin layer of the fluorescent material-contained resin comprises a film.

11. A light-emitting diode according to claim 9, wherein the concave portion of the substrate is a hole passing through the substrate.

* * * * *

UNITED STATES PATENT AND TRADEMARK OFFICE
CERTIFICATE OF CORRECTION

| | |
|---|---|
| PATENT NO. | : 7,334,907 B2 |
| APPLICATION NO. | : 11/089020 |
| DATED | : February 26, 2008 |
| INVENTOR(S) | : Nagayama |

It is certified that error appears in the above-identified patent and that said Letters Patent is hereby corrected as shown below:

In column 8, lines 34-35, delete the words "side surface" and insert --side surfaces--.

Signed and Sealed this

Nineteenth Day of May, 2009

JOHN DOLL
*Acting Director of the United States Patent and Trademark Office*